United States Patent
Railkar et al.

(10) Patent No.: US 10,141,245 B2
(45) Date of Patent: Nov. 27, 2018

(54) HIGH-POWER ACOUSTIC DEVICE WITH IMPROVED PERFORMANCE

(71) Applicant: Qorvo US, Inc., Greensboro, NC (US)

(72) Inventors: Tarak A. Railkar, Plano, TX (US); Ian Y. Yee, Austin, TX (US); Jeffrey D. Galipeau, Apopka, FL (US); Jason Wu, Windermere, FL (US); Rodolfo E. Chang, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/685,850

(22) Filed: Aug. 24, 2017

(65) Prior Publication Data
US 2018/0061744 A1    Mar. 1, 2018

Related U.S. Application Data

(60) Provisional application No. 62/378,803, filed on Aug. 24, 2016.

(51) Int. Cl.
*H01L 23/52* (2006.01)
*H01L 21/50* (2006.01)
(Continued)

(52) U.S. Cl.
CPC ...... *H01L 23/49513* (2013.01); *B81B 7/0061* (2013.01); *H01L 21/02186* (2013.01);
(Continued)

(58) Field of Classification Search
CPC . H01L 23/49513; H01L 21/52; H01L 21/563; H01L 21/4853; H01L 21/02186;
(Continued)

(56) References Cited

U.S. PATENT DOCUMENTS

2003/0060172 A1* 3/2003 Kuriyama ............ H04B 1/036
455/575.1
2012/0250925 A1* 10/2012 Lillelund ............ H04R 19/016
381/355

(Continued)

OTHER PUBLICATIONS

Heraeus Electronics, "mAgic Sinter Pastes for high performance applications," Available online at: <<https://www.heraeus.com/en/het/products_and_solutions_het/sinter_materials/sinter_materials_page.aspx>>, Accessed Apr. 24, 2018, 3 pages.
(Continued)

*Primary Examiner* — Brian Turner
(74) *Attorney, Agent, or Firm* — Withrow & Terranova, P.L.L.C.

(57) ABSTRACT

The present disclosure relates to a high-power acoustic device with improved performance. The disclosed acoustic device includes a substrate, a die-attach material, and an acoustic die. The substrate includes a substrate body and a die pad on a top surface of the substrate body. The die-attach material is a sintered material and applied over the die pad. The acoustic die is coupled to the die pad via the die-attach material. Herein, the acoustic die includes a die body and a metallization structure, which is sandwiched between the die body and the die-attach material.

19 Claims, 5 Drawing Sheets

Figure 1:
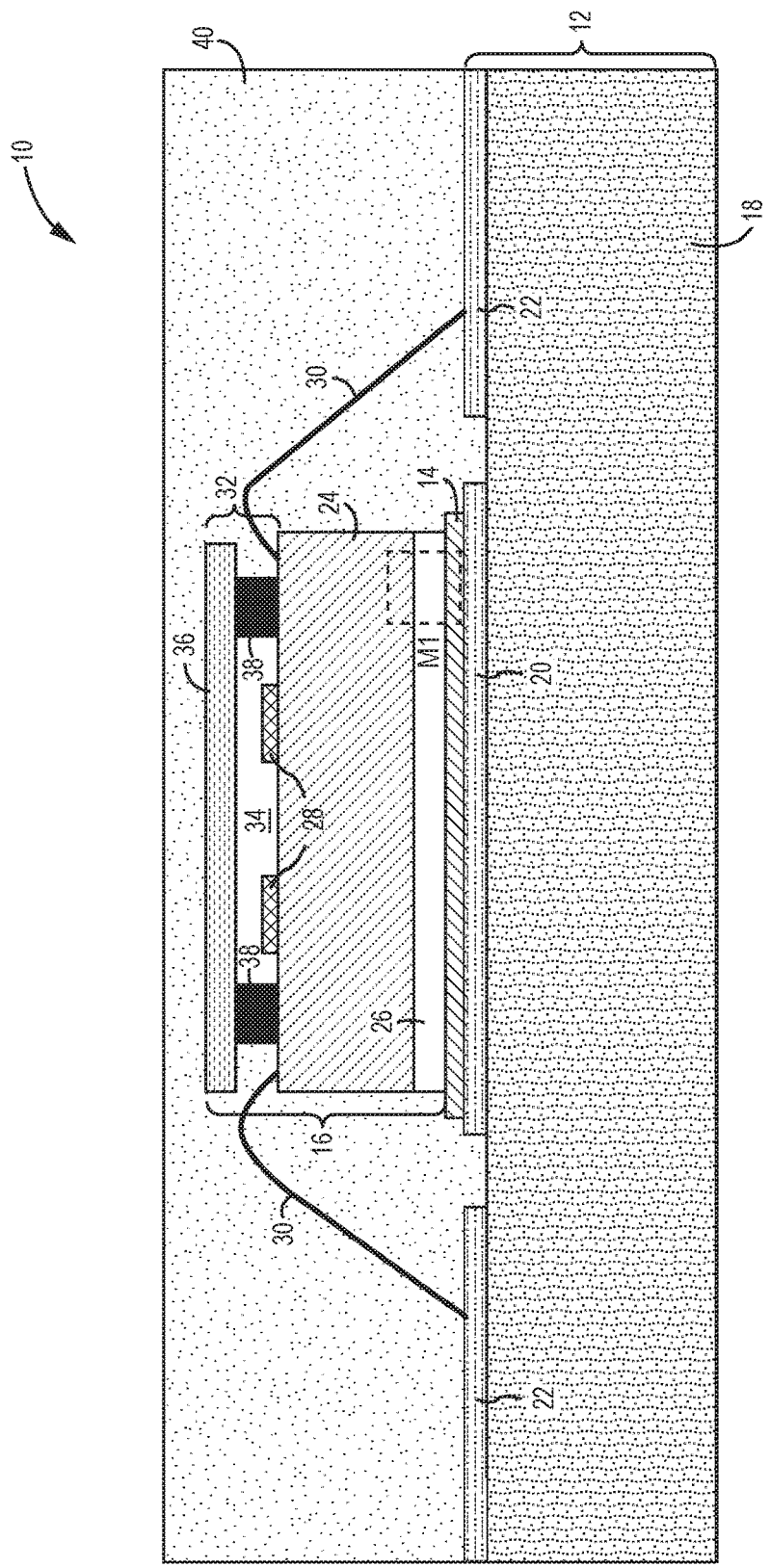

(51) Int. Cl.

| | | |
|---|---|---|
| *H01L 21/44* | (2006.01) | |
| *H05K 1/14* | (2006.01) | |
| *B23K 20/24* | (2006.01) | |
| *H01L 23/495* | (2006.01) | |
| *H01L 21/52* | (2006.01) | |
| *H01L 21/56* | (2006.01) | |
| *H01L 23/532* | (2006.01) | |
| *H01L 21/02* | (2006.01) | |
| *H01L 21/48* | (2006.01) | |
| *B81B 7/00* | (2006.01) | |
| *H01L 23/482* | (2006.01) | |
| *H01L 23/00* | (2006.01) | |
| *H03H 9/00* | (2006.01) | |
| *H03H 9/08* | (2006.01) | |

(52) U.S. Cl.
CPC ......... *H01L 21/4853* (2013.01); *H01L 21/52* (2013.01); *H01L 21/563* (2013.01); *H01L 23/482* (2013.01); *H01L 23/49506* (2013.01); *H01L 23/53228* (2013.01); *H01L 23/53242* (2013.01); *H01L 24/00* (2013.01); *H03H 9/00* (2013.01); *H03H 9/08* (2013.01)

(58) Field of Classification Search
CPC ......... H01L 23/53228; H01L 23/49506; H01L 23/53242; H01L 21/288; H01L 23/3121; H01L 24/09; H05K 1/092; H05K 1/162; H05K 1/165
See application file for complete search history.

(56) References Cited

U.S. PATENT DOCUMENTS

| | | | | |
|---|---|---|---|---|
| 2012/0274421 | A1* | 11/2012 | Hara | H03H 7/38 333/195 |
| 2014/0036466 | A1* | 2/2014 | Pahl; Wolfgang | H01L 23/04 361/769 |
| 2015/0333031 | A1* | 11/2015 | Viswanathan | H01L 24/83 257/746 |
| 2016/0129530 | A1* | 5/2016 | Greve | B23K 35/025 75/228 |
| 2017/0221800 | A1* | 8/2017 | Nishikizawa | H01L 23/495 |

OTHER PUBLICATIONS

Namics Corporation, "Metal Organic (MO) Technology: Low-temperature Sintered Conductive Pastes Using MO Technology; Stretchable Conductive Pastes; Air-curable Conductive Copper Paste," Available online at: <<https://www.namics.co.jp/e/product/development04.html>>, Accessed Apr. 24, 2018, 3 pages.

* cited by examiner

HIGH-POWER ACOUSTIC DEVICE WITH IMPROVED PERFORMANCE

RELATED APPLICATIONS

This application claims the benefit of provisional patent application Ser. No. 62/378,803, filed Aug. 24, 2016, the disclosure of which is hereby incorporated herein by reference in its entirety.

FIELD OF THE DISCLOSURE

The present disclosure relates to an acoustic device and a process for making the same, and more particularly to a high-power acoustic device with improved performance, and an assembly process for a high-power acoustic device.

BACKGROUND

Acoustic devices are widely used in modern electronics. Exemplary acoustic devices include surface acoustic wave (SAW) filters and bulk acoustic wave (BAW) filters, which are increasingly used in the transmission and reception of radio frequency (RF) signals for wireless communications.

Current and emerging applications, such as Base Station Small Cells, pre-5G, 5G, massive multiple-inputs/multiple outputs (MIMO), Repeaters, and Boosters, often require higher levels of RF/acoustic power handling by the acoustic devices. For the acoustic filter, the increased heat generation during its operation may greatly affect the frequency stability of filter response and impede the desired performance of the acoustic filters. Due to device architecture as well as component packaging requirements of the acoustic device, it is typically not efficient to provide a thermally conductive path from the top-side of the acoustic device. In such situations, a superior thermal dissipation path that removes the heat away from the back-side of the acoustic device is desired.

Typically, an acoustic device leverages epoxy based materials for attaching a conventional acoustic die to a substrate. Due to the relatively low thermal conductivity of die-attach epoxies, the thermal impedance of the heat removal path at the back-side of the acoustic device is relatively high. To accommodate the increased heat generation within the acoustic devices, it is therefore an object of the present disclosure to provide an improved design for high-power acoustic devices. Further, there is also a need to improve the performance of the acoustic device without significantly increasing the device size.

SUMMARY

The present disclosure relates to a high-power acoustic device with improved performance. The disclosed acoustic device includes a substrate, a die-attach material, and an acoustic die. The substrate includes a substrate body and a die pad on a top surface of the substrate body. The die-attach material is a sintered material and is applied over the die pad. The acoustic die is coupled to the die pad via the die-attach material. Herein, the acoustic die includes a die body and a metallization structure, which is sandwiched between the die body and the die-attach material.

In one embodiment of the acoustic device, the metallization structure provides adhesion to the die body, chemical bonding to the die-attach material, and a wetting function that provides superior interface between the die body and die-attach material.

In one embodiment of the acoustic device, the metallization structure includes a first layer that is in contact with the die body and provides the adhesion to the die body, a second layer that is in contact with the die-attach material and provides the chemical bonding to the die-attach material, and a third layer that is sandwiched between the first layer and the second layer and provides the wetting function. Herein, the first layer is formed of Titanium (Ti), Titanium Tungsten (TiW), or Chromium (Cr), the second layer is formed of gold (Au) or silver (Ag), and the third layer is formed of TiW, Au, Nickel-Vanadium (NiV), or Nickel (Ni).

In one embodiment of the acoustic device, the metallization structure includes a first layer that is in contact with the die body and provides the adhesion to the die body and the wetting function, and a second layer that is sandwiched between the first layer and the die-attach material and provides the chemical bonding to the die-attach material. Herein, the first layer is formed of Ti, TiW or Cr, and the second layer is formed of Au or Ag.

In one embodiment of the acoustic device, the metallization structure includes a first layer that is in contact with the die body and provides the adhesion to the die body, and a second layer that is sandwiched between the first layer and the die-attach material. The second layer provides the chemical bonding to the die-attach material and the wetting function. Herein, the first layer is formed of Ti, TiW, or Cr, and the second layer is formed of Au or Ag.

In one embodiment of the acoustic device, the metallization structure is formed of at least one of a group consisting of TiW, Ti, Cr, Ni, NiV, Au and Ag.

In one embodiment of the acoustic device, the acoustic die further includes a number of acoustic components at a top surface of the die body and an enclosure coupled to the top surface of the die body to encapsulate the acoustic components. Herein, the enclosure includes a cap and an outer wall extending from the cap to the top surface of the die body.

In one embodiment of the acoustic device, the substrate further includes a number of wire-contacts on the top surface of the substrate body and surrounding the die pad. The acoustic die further includes a number of wires, each of which is outside the enclosure and extends from the top surface of the die body to a corresponding wire-contact on the top surface of the substrate body.

In one embodiment of the acoustic device, the substrate body is formed of one of a group consisting of FR-4, BT-NS, PTFE, Rogers RO4003, RO6035, and LCP.

In one embodiment of the acoustic device, the substrate body is formed of one of a group consisting of alumina, low temperature co-fired ceramic (LTCC), or high temperature co-fired ceramic (HTCC).

In one embodiment of the acoustic device, the substrate is a printed circuit board (PCB).

In one embodiment of the acoustic device, the die-attach material is sintered silver, sintered copper, or sintered gold.

In one embodiment of the acoustic device, the acoustic die is a bulk acoustic wave (BAW) die.

In one embodiment of the acoustic device, the acoustic die is a surface acoustic wave (SAW) die.

In one embodiment of the acoustic device, the substrate further includes a heat spreader embedded in the substrate body. The heat spreader is thermally coupled to the die pad and extends from the top surface of the substrate body to a bottom surface of the substrate body.

In one embodiment of the acoustic device, the substrate further includes a number of thermal vias. Each thermal via is thermally coupled to the die pad and extends from the top surface of the substrate body to a bottom surface of the substrate body According to another embodiment, the acoustic device further includes a molding compound formed over the substrate to encapsulate the acoustic die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides an exemplary acoustic device according to one embodiment of the present disclosure.

Figure 2B:
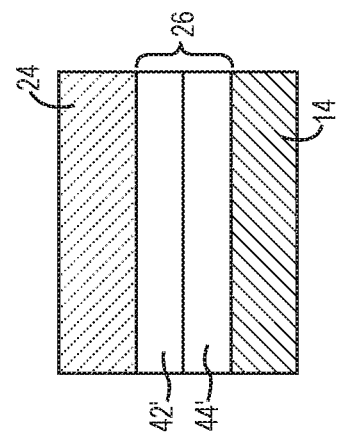
Figure 2A:
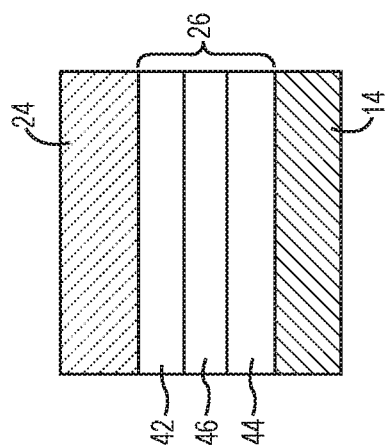

FIGS. 2A-2B provide details of an exemplary metallization structure included in the exemplary acoustic device shown in FIG. 1.

Figure 3:
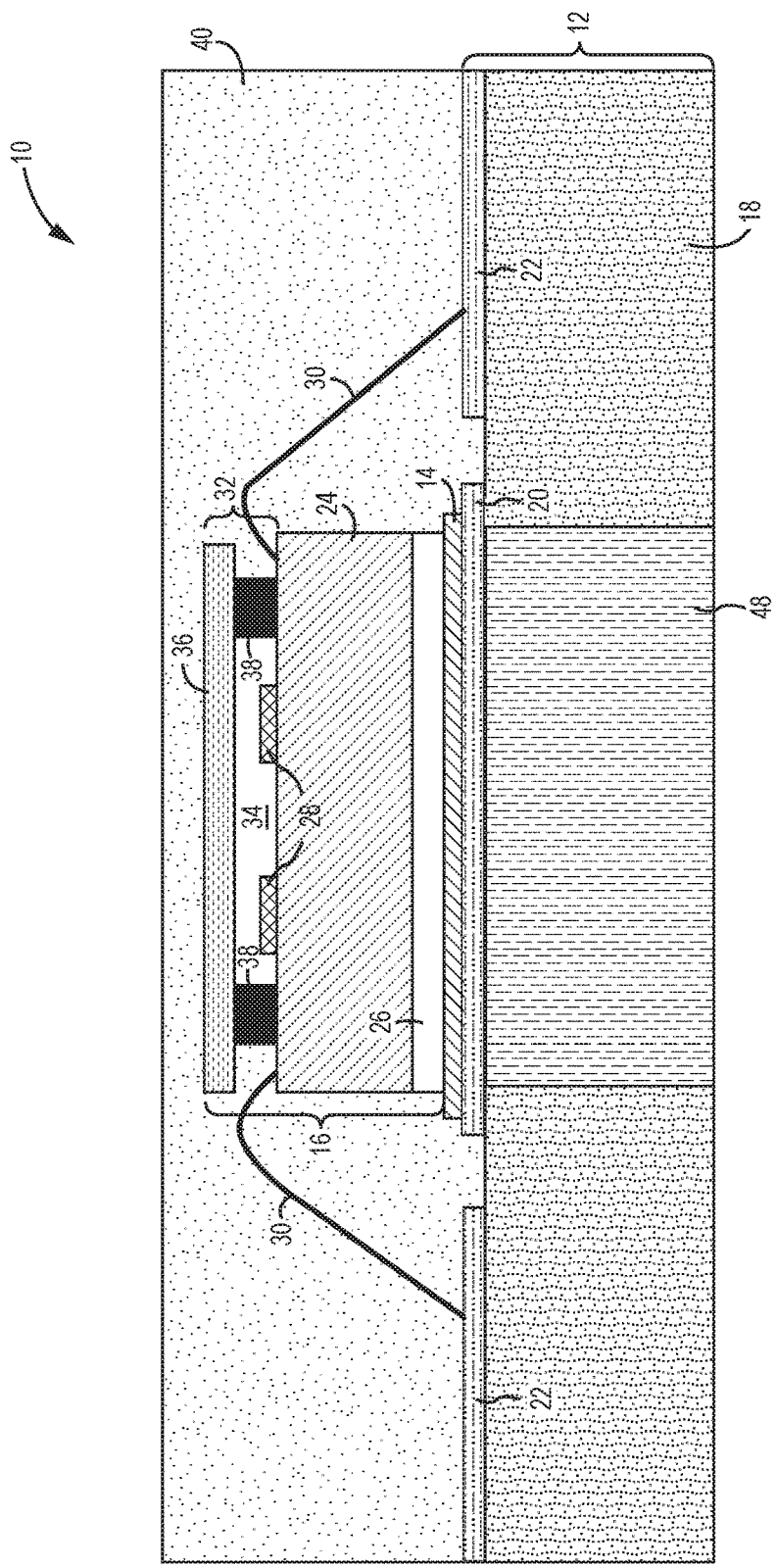

FIG. 3 provides an alternative acoustic device according to one embodiment of the present disclosure.

Figure 4:
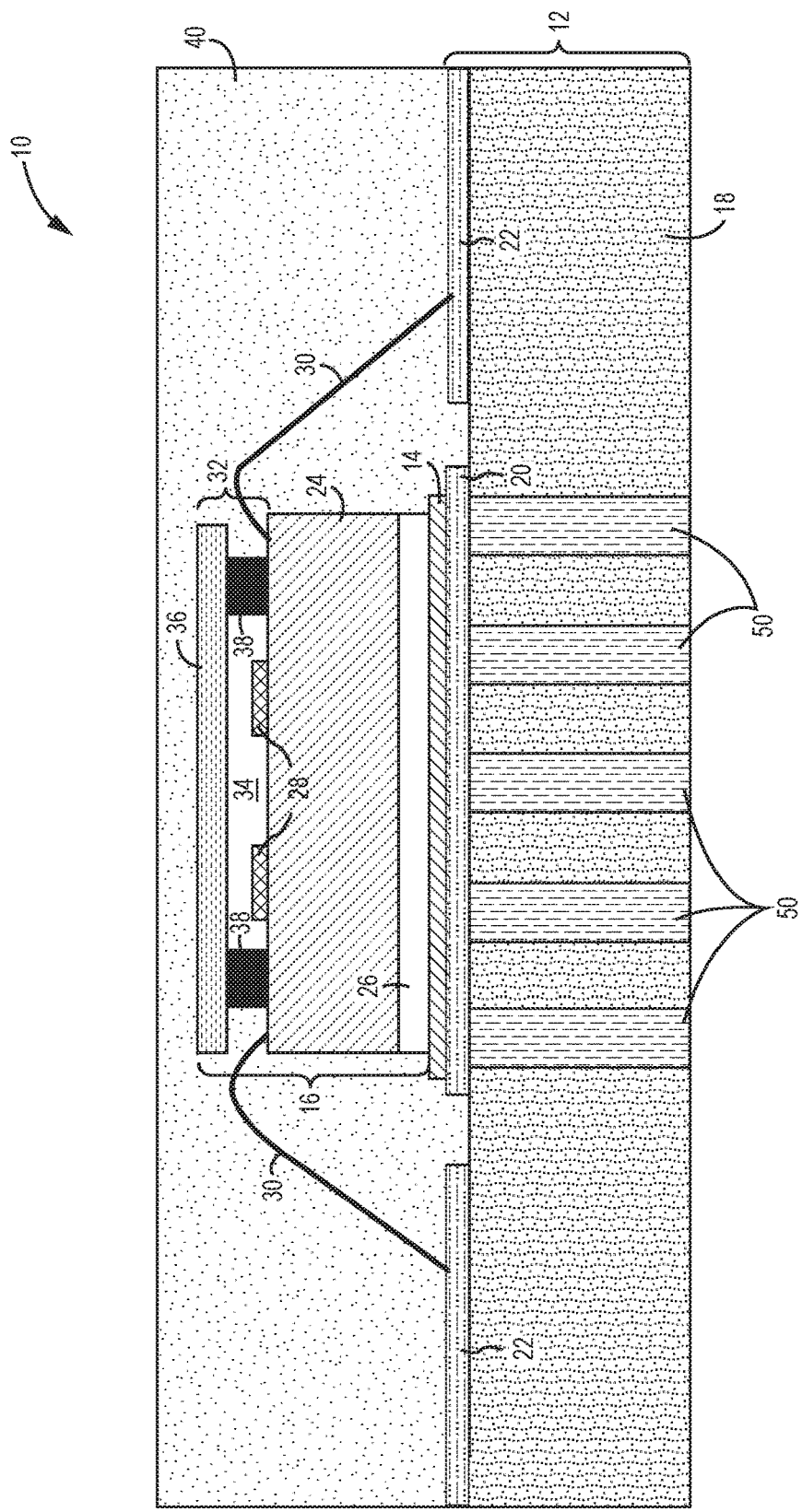

FIG. 4 provides an alternative acoustic device according to one embodiment of the present disclosure.

Figure 5:
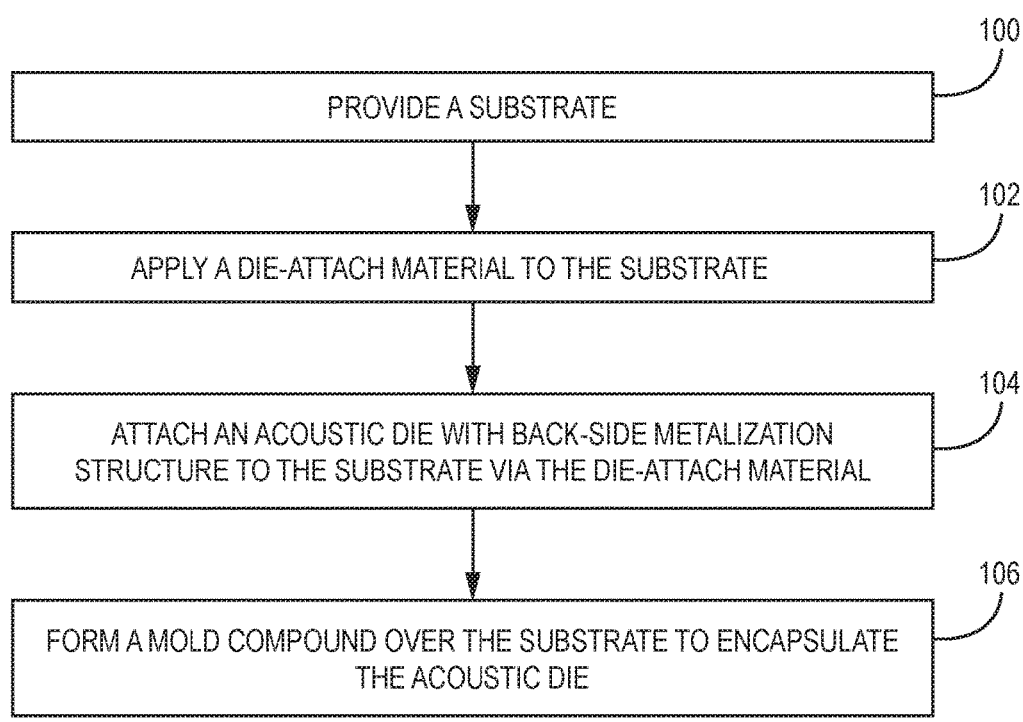

FIG. 5 provides a flow diagram that illustrates an exemplary process to provide the acoustic device shown in FIG. 1.

It will be understood that for clear illustrations, FIG. 1-FIG. 5 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a high-power acoustic device with improved performance, and an assembly process for making the same. FIG. 1 shows an exemplary acoustic device 10 according to one embodiment of the present disclosure. For the purpose of this illustration, the exemplary acoustic device 10 includes a substrate 12, a die-attach material 14, and an acoustic die 16. In different applications, the acoustic device 10 may include multiple acoustic dies or other module components (not shown).

The substrate 12 includes a substrate body 18, a die pad 20, and a number of wire-contacts 22. The die pad 20 and the wire-contacts 22 reside on a top surface of the substrate body 18, and the wire-contacts 22 surround the die pad 20. If there are multiple acoustic dies included in the acoustic device 10, the substrate 12 may include multiple die pads 20. In addition, the substrate 12 may include a number of metal connection structures (not shown) that are embedded in the substrate body 18 and coupled to the die pad 20 and/or the wire-contacts 22. The substrate 12 may be a printed circuit board (PCB) or other laminate construction. The substrate body 18 may be formed of organic laminate materials, such as FR-4, BT-NS, PTFE, Rogers RO4003, RO6035, LCP and the like, or may be formed of ceramic materials, such as alumina, low temperature co-fired ceramic (LTCC), high temperature co-fired ceramic (HTCC), and the like. The die pad 20 and the wire-contacts 22 may be formed of copper, with a protective coating of suitable materials such as palladium, nickel, gold, or an alloy thereof.

The die-attach material 14 directly resides over the die pad 20 and may not extend beyond the die pad 20 in either X or Y dimension. The die-attach material 14 may be formed of a sintered material, such as sintered silver, sintered copper, and sintered gold, because of their superior thermal and electrical properties. The die-attach material 14 may have a thermal conductivity greater than 40 W/m·K.

The acoustic die 16 is mechanically and thermally coupled to the die pad 20 via the die-attach material 14. The X-Y dimensions of the acoustic die 16 may be larger than, equal to, or smaller than the X-Y dimensions of the die-attach material 14. Herein, the acoustic die 16 may be a bulk acoustic wave (BAW) die or a surface acoustic wave (SAW) die, and the die pad 20 may be a ground plane for the acoustic die 16. In detail, the acoustic die 16 includes a die body 24, a metallization structure 26, a number of acoustic components 28, and a number of wires 30. The metallization structure 26 is formed at a bottom side of the acoustic die 16 and sandwiched between a bottom surface of the die body 24 and the die-attach material 14. The acoustic components 28 are formed at a top surface of the die body 24 and each wire 30 extends from the top surface of the die body 24 to a corresponding wire-contact 22 on the top surface of the substrate body 18. The wires 30 may be formed of gold, copper or aluminum.

The metallization structure 26 sandwiched between the die-attach material 14 and the die body 24 provides chemical bonding to the die-attach material 14, adhesion to the die body 24, and a wetting function that provides superior interface between the die body 24 and the die-attach material 14. Herein, the metallization structure 26 not only helps attach the acoustic die 16 to the substrate 12 via the die-attach material 14 (especially sintered materials), but also helps spread the heat that is generated in the acoustic die 16 during its operation. The metallization structure 26 is formed of one or more metal materials, such as gold (Au), silver (Ag), Titanium (Ti), Titanium Tungsten (TiW), Chromium (Cr), Nickel-Vanadium (NiV), and Nickel (Ni), depending on materials (like silicon, silicon germanium, or other materials) used in the die body 24. The metallization structure 26 has a thickness between 0.05 µm and 5 µm, or between 0.1 µm and 1 µm. The one or more metal materials used in the metallization structure 26 have superior thermal conductivity (>40 W/m·K), such that the thermal impedance of a heat removal path from the back side of the acoustic die 16 (through the metallization structure 26 and the die-attach material 14) to the substrate 12 will be significantly reduced. Consequently, the heat generated in the acoustic die 16 will efficiently dissipate through the back-side heat removal path, and the thermal and electrical performance of the acoustic die 16 is enhanced. The metallization structure 26 has a thickness between 0.05 µm and 5 µm, or between 0.1 µm and 1 µm.

In addition, the acoustic die 16 may further include an enclosure 32 that is coupled to the top surface of the die body 24 to provide a sealed cavity 34. The acoustic components 28 are encapsulated by the enclosure 32 within the sealed cavity 34. Herein, the sealed cavity 34 provides the necessary clearance for high-frequency operation of the acoustic die 16 due to the acoustic components 28 exposure to the sealed cavity 34. It is clear to those skilled in the art that each wire 30 is outside the sealed cavity 34 and not encapsulated by the enclosure 32. Herein, the enclosure 32 includes a cap 36 and an outer wall 38 that extends from the cap 36 to the top surface of the die body 24. The cap 36 may be formed of silicon lid or dry laminated film (like TMMF or SU-8) with a thickness between 35 µm and 150 µm. The outer wall 38 may be formed of photo-epoxy SU-8 or dry laminated film (like TMMF or SU-8) with a thickness between 15 µm and 70 µm.

In some applications, the acoustic device 10 may include a mold compound 40 to protect the acoustic die 16 from the external environment. The mold compound 40 is formed over the substrate 12 to encapsulate the acoustic die 16. The first mold compound 40 may be an organic epoxy resin system or the like, and applied by various procedures, such as sheet molding, overmolding, compression molding, transfer molding, dam fill encapsulation, or screen print encapsulation. Since the cap 36 and the outer wall 38 are relatively thick, the enclosure 32 is strong enough to ensure a typical molding pressure during a molding process.

FIGS. 2A-2B provide details of the metallization structure 26 included in the exemplary acoustic device 16 within a dashed section M1 of FIG. 1. As shown in FIG. 2A, the metallization structure 26 is a stack-up structure and may include a first layer 42 in contact with the die body 24, a second layer 44 in contact with the die-attach material 14, and a third layer 46 sandwiched between the first layer 42 and the second layer 44. The first layer 42 may be formed of Ti, TiW, or Cr, and provides the adhesion to the die body 24. The second metal layer 44 may be formed of Au or Ag, and provides the chemical bonding to the die-attach material 14. The third metal layer 46 may be formed of TiW, Au, NiV, or Ni, and provides the wetting function that provides superior interface between the die body 24 and the die-attach material 14.

In some applications, the metallization structure 26 may only include two metal layers: a first layer 42' and a second layer 44', as illustrated in FIG. 2B. In one embodiment, the first layer 42' is in contact with the die body 24 and may provide both the adhesion to the die body 24 and the wetting function. The second metal layer 44' is sandwiched between the die-attach material 14 and the first layer 42', and may provide both the wetting function and the chemical bonding to the die-attach material 14. In another embodiment, the first layer 42' may provide the adhesion to the die body 24, while the second layer 44' may provide both the chemical bonding to the die-attach material 14 and the wetting function. Alternatively, the first layer 42' may provide both the adhesion to the die body 24 and the wetting function, while the second layer 44' may provide the chemical bonding to the die-attach material 14. The first layer 42' may be formed of TiW, Ti, or Cr, and the second metal layer 44' may be formed of Au or Ag.

In order to further enhance the thermal performance of the acoustic device 10, the substrate 12 may include a heat spreader 48 embedded in the substrate body 18, as illustrated in FIG. 3. The heat spreader 48 is thermally coupled to the die pad 20 and extends from the top surface of the substrate body 18 to a bottom surface of the substrate body 18. As such, the heat spreader 48 may conduct heat generated from the acoustic die 16 toward the bottom surface of the substrate body 18. The heat spreader 48 may be a metal slug and formed of copper or ceramic materials such as aluminum oxide ($Al_2O_3$, $Al_3O_4$), aluminum nitride (AlN) and other similar materials. In another embodiment, the substrate 12 may include a number of thermal vias 50 to conduct heat generated from the acoustic die 16 as illustrated in FIG. 4. Each thermal via 50 is thermally coupled to the die pad 20 and extends from the top surface of the substrate body 18 to a bottom surface of the substrate body 18. The thermal vias 50 may be formed of plated copper or filled with suitable epoxy materials.

FIG. 5 provides a flow diagram that illustrates an exemplary process to provide the acoustic device 10 shown in FIG. 1. Initially, the substrate 12 which includes the substrate body 18, the die pad 20, and the wire-contacts 22, is provided (step 100). The die pad 20 and the wire-contacts 22 reside on the top surface of the substrate body 18, and the wire-contacts 22 surround the die pad 20. Next, the die-attach material 14 is applied to the substrate 12 by dispensing, stencil/screen printing or other similar method (step 102). In particular, the die-attach material 14 is applied directly over the die pad 20. The acoustic die 16, which includes the die body 24, the metallization structure 26, the acoustic components 28, the wires 30, and the enclosure 32, is then attached to the substrate 12 (step 104). The metallization structure 26 is in contact with the bottom surface of the die body 24 (at the back-side of the acoustic die 16), and coupled to the die pad 20 via the die-attach material 14. The acoustic components 28 and the enclosure 32 are formed at a top surface of the die body 24, and the acoustic components 28 are encapsulated by the enclosure 32. Each wire 30 extends from the top surface of the die body 24 to a corresponding wire-contact 22 on the top surface of the substrate body 18. In some applications, there may be more than one acoustic die or other module components attached to the substrate 12. Finally, the mold compound 40 is formed over the substrate 12 to encapsulate the acoustic die 16 (step 106). The mold compound 40 may be formed by various procedures, such as sheet molding, overmolding, compression molding, transfer molding, dam fill encapsulation, or screen print encapsulation.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a substrate comprising a substrate body and a die pad on a top surface of the substrate body;
   a die-attach material applied over the die pad, wherein the die-attach material is a sintered material;
   an acoustic die coupled to the die pad via the die-attach material, wherein:
   the acoustic die includes a plurality of acoustic components, a die body and a metallization structure;
   the plurality of acoustic components resides over a top surface of the die body and the metallization structure resides over a bottom surface of the die body; and
   the metallization structure is vertically sandwiched between the die body and the die-attach material.

2. The apparatus of claim 1 wherein the metallization structure provides adhesion to the die body, chemical bonding to the die-attach material, and a wetting function that provides an interface between the die body and die-attach material.

3. The apparatus of claim 2 wherein the metallization structure comprises:
   a first layer that is in contact with the die body and provides the adhesion to the die body;
   a second layer that is in contact with the die-attach material and provides the chemical bonding to the die-attach material; and
   a third layer that is sandwiched between the first layer and the second layer and provides the wetting function.

4. The apparatus of claim 3 wherein:
   the first layer is formed of Titanium (Ti), Titanium Tungsten (TiW), or Chromium (Cr);
   the second layer is formed of gold (Au) or silver (Ag); and
   the third layer is formed of TiW, Au, Nickel-Vanadium (NiV), or Nickel (Ni).

5. The apparatus of claim 2 wherein the metallization structure comprises:
   a first layer that is in contact with the die body and provides the adhesion to the die body and the wetting function; and
   a second layer that is sandwiched between the first layer and the die-attach material and provides the chemical bonding to the die-attach material.

6. The apparatus of claim 2 wherein the metallization structure comprises:
   a first layer that is in contact with the die body and provides the adhesion to the die body; and
   a second layer sandwiched between the first layer and the die-attach material, wherein the second layer provides the chemical bonding to the die-attach material and the wetting function.

7. The apparatus of claim 2 wherein the metallization structure comprises:
   a first layer that is in contact with the die body and provides the adhesion to the die body and the wetting function; and
   a second layer sandwiched between the first layer and the die-attach material, wherein the second layer provides the chemical bonding to the die-attach material and the wetting function.

8. The apparatus of claim 2 wherein the metallization structure is formed of at least one of a group consisting of TiW, Ti, Cr, Ni, NiV, Ag, and Au.

9. The apparatus of claim 1 wherein the acoustic die further includes an enclosure coupled to the top surface of the die body to encapsulate the plurality of acoustic components, wherein the enclosure includes a cap and an outer wall extending from the cap to the top surface of the die body.

10. The apparatus of claim 9 wherein:
    the substrate further comprises a plurality of wire-contacts on the top surface of the substrate body and surrounding the die pad; and
    the acoustic die further comprises a plurality of wires, wherein each of the plurality of wires is outside the enclosure and extends from the top surface of the die body to a corresponding wire-contact on the top surface of the substrate body.

11. The apparatus of claim 1 wherein the substrate body is formed of one of a group consisting of FR-4, BT-NS, PTFE, Rogers RO4003, RO6035, and LCP.

12. The apparatus of claim 1 wherein the substrate body is formed of one of a group consisting of alumina, low temperature co-fired ceramic (LTCC), or high temperature co-fired ceramic (HTCC).

13. The apparatus of claim 1 wherein the substrate is a printed circuit board (PCB).

14. The apparatus of claim 1 wherein the die-attach material is one of a group consisting of sintered silver, sintered copper, and sintered gold.

15. The apparatus of claim 1 wherein the acoustic die is a bulk acoustic wave (BAW) die.

16. The apparatus of claim 1 wherein the acoustic die is a surface acoustic wave (SAW) die.

17. The apparatus of claim 1 wherein the substrate further comprises a heat spreader embedded in the substrate body, wherein the heat spreader is thermally coupled to the die pad and extends from the top surface of the substrate body to a bottom surface of the substrate body.

18. The apparatus of claim 1 wherein the substrate further includes a plurality of thermal vias, wherein each of the plurality of thermal vias is thermally coupled to the die pad and extends from the top surface of the substrate body to a bottom surface of the substrate body.

19. The apparatus of claim 1 further comprising a molding compound formed over the substrate to encapsulate the acoustic die.

\* \* \* \* \*